United States Patent
Kumura

(10) Patent No.: US 9,312,476 B2
(45) Date of Patent: Apr. 12, 2016

(54) MAGNETIC MEMORY

(71) Applicant: Yoshinori Kumura, Seoul (KR)

(72) Inventor: Yoshinori Kumura, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/631,049

(22) Filed: Feb. 25, 2015

(65) Prior Publication Data

US 2015/0179923 A1    Jun. 25, 2015

Related U.S. Application Data

(63) Continuation of application No. 14/018,215, filed on Sep. 4, 2013, now Pat. No. 8,987,846.

(60) Provisional application No. 61/804,517, filed on Mar. 22, 2013.

(51) Int. Cl.

| | | |
|---|---|---|
| *H01L 27/00* | (2006.01) | |
| *H01L 43/00* | (2006.01) | |
| *H01L 43/08* | (2006.01) | |
| *H01L 43/02* | (2006.01) | |
| *H01L 43/12* | (2006.01) | |
| *H01L 27/24* | (2006.01) | |
| *H01L 27/22* | (2006.01) | |

(Continued)

(52) U.S. Cl.
CPC ............ *H01L 43/08* (2013.01); *H01F 10/3254* (2013.01); *H01F 41/307* (2013.01); *H01L 27/228* (2013.01); *H01L 27/2472* (2013.01); *H01L 43/02* (2013.01); *H01L 43/12* (2013.01)

(58) Field of Classification Search
CPC ...... H01L 43/02; H01L 43/08; H01L 27/2472; H01L 27/228; H01L 43/12; H01F 41/307; H01F 10/3254
See application file for complete search history.

(56) References Cited

U.S. PATENT DOCUMENTS 6,462,395 B1    10/2002  Fukuda et al.
6,809,361 B2 *  10/2004  Honlein et al. ............... 257/295
6,992,342 B2 *   1/2006  Motoyoshi et al. .......... 257/295

(Continued)

FOREIGN PATENT DOCUMENTS

JP    2001127151 A    5/2001
JP    2008130807 A    6/2008

(Continued)

OTHER PUBLICATIONS

Bandaru, "Electrical Properties and Applications of carbon nanotube Structures", 2007, Journal of Nanoscience and Nanotechnology, vol. 7, pp. 1-29 (Jan. 2007).*

(Continued)

*Primary Examiner* — Nikolay Yushin
(74) *Attorney, Agent, or Firm* — Holtz, Holtz & Volek PC

(57) ABSTRACT

According to one embodiment, a magnetic memory is disclosed. The magnetic memory includes a substrate, and a contact plug provided on the substrate. The contact plug includes a first contact plug, and a second contact plug provided on the first contact plug and having a smaller diameter than that of the first contact plug. The magnetic memory further includes a magnetoresistive element provided on the second contact plug. The diameter of the second contact plug is smaller than that of the magnetoresistive element.

7 Claims, 14 Drawing Sheets

(51) Int. Cl.
*H01F 10/32* (2006.01)
*H01F 41/30* (2006.01)

(56) References Cited

U.S. PATENT DOCUMENTS

| | | |
|---|---|---|
| 7,463,509 B2 | 12/2008 | Kim et al. |
| 8,492,808 B2 * | 7/2013 | Omori et al. ............... 257/295 |
| 2004/0023496 A1 | 2/2004 | Jung et al. |
| 2004/0113175 A1 * | 6/2004 | Motoyoshi et al. ......... 257/200 |
| 2004/0183110 A1 * | 9/2004 | Honlein et al. ............. 257/295 |
| 2004/0188730 A1 | 9/2004 | Lin et al. |
| 2005/0140016 A1 | 6/2005 | Shim et al. |
| 2008/0135958 A1 | 6/2008 | Kajiyama et al. |
| 2008/0268640 A1 | 10/2008 | Fang et al. |
| 2011/0254112 A1 | 10/2011 | Yamanaka et al. |
| 2011/0266600 A1 | 11/2011 | Kanaya |
| 2012/0043630 A1 * | 2/2012 | Omori et al. ............... 257/421 |
| 2012/0135543 A1 | 5/2012 | Shin et al. |
| 2012/0156844 A1 | 6/2012 | Kim et al. |
| 2012/0193693 A1 | 8/2012 | Kanaya |
| 2012/0326250 A1 | 12/2012 | Gaidis et al. |
| 2013/0015541 A1 | 1/2013 | Kanaya |
| 2014/0284743 A1 | 9/2014 | Aikawa et al. |

FOREIGN PATENT DOCUMENTS

| | | |
|---|---|---|
| JP | 2011228443 A | 11/2011 |
| JP | 2011233835 A | 11/2011 |
| JP | 2012119684 A | 6/2012 |
| JP | 2012160671 A | 8/2012 |
| JP | 2013021108 A | 1/2013 |
| TW | 251294 B | 7/1995 |
| TW | 355042 B | 3/1999 |
| TW | 242041 | 10/2005 |
| TW | 201230142 A | 7/2012 |
| WO | 2008108109 A1 | 9/2008 |

OTHER PUBLICATIONS

U.S. Appl. No. 14/015,966; First Named Inventor: Hisanori Aikawa; Title: "Magnetic Storage Device", filed Aug. 30, 2013.

International Search Report including Written Opinion dated May 13, 2014, issued in International Application No. PCT/JP 2014/057642.

Taiwanese Office Action dated Jul. 14, 2015 (and English translation thereof), issued in counterpart Taiwanese Application No. 103108951.

* cited by examiner

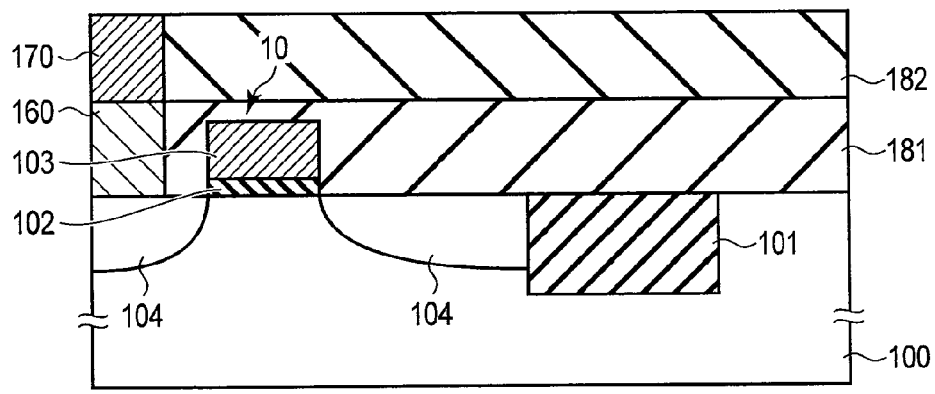
F I G. 2
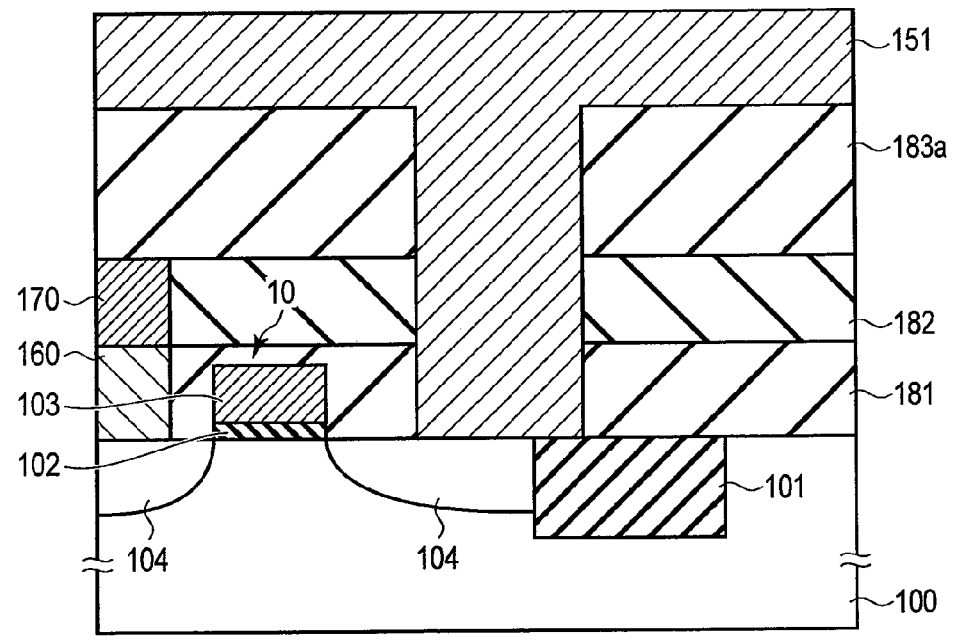
F I G. 3

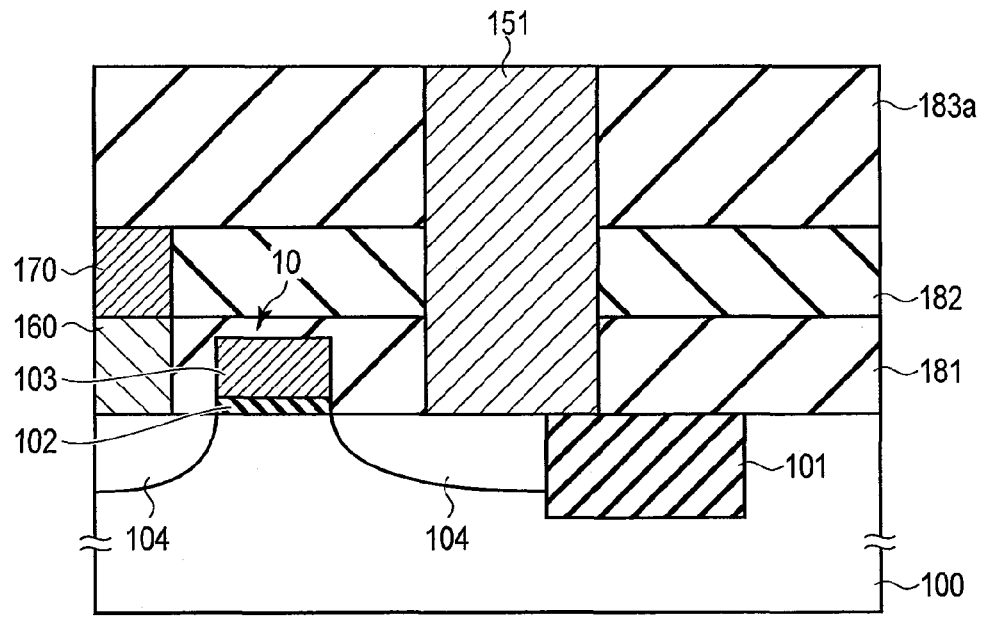
F I G. 4
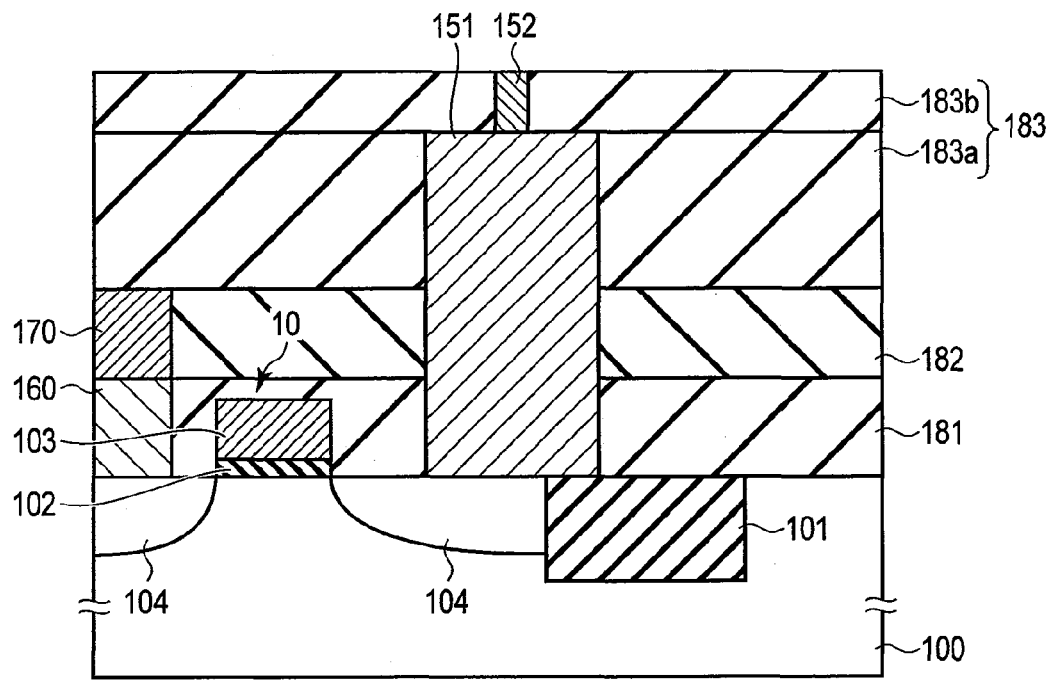
F I G. 5

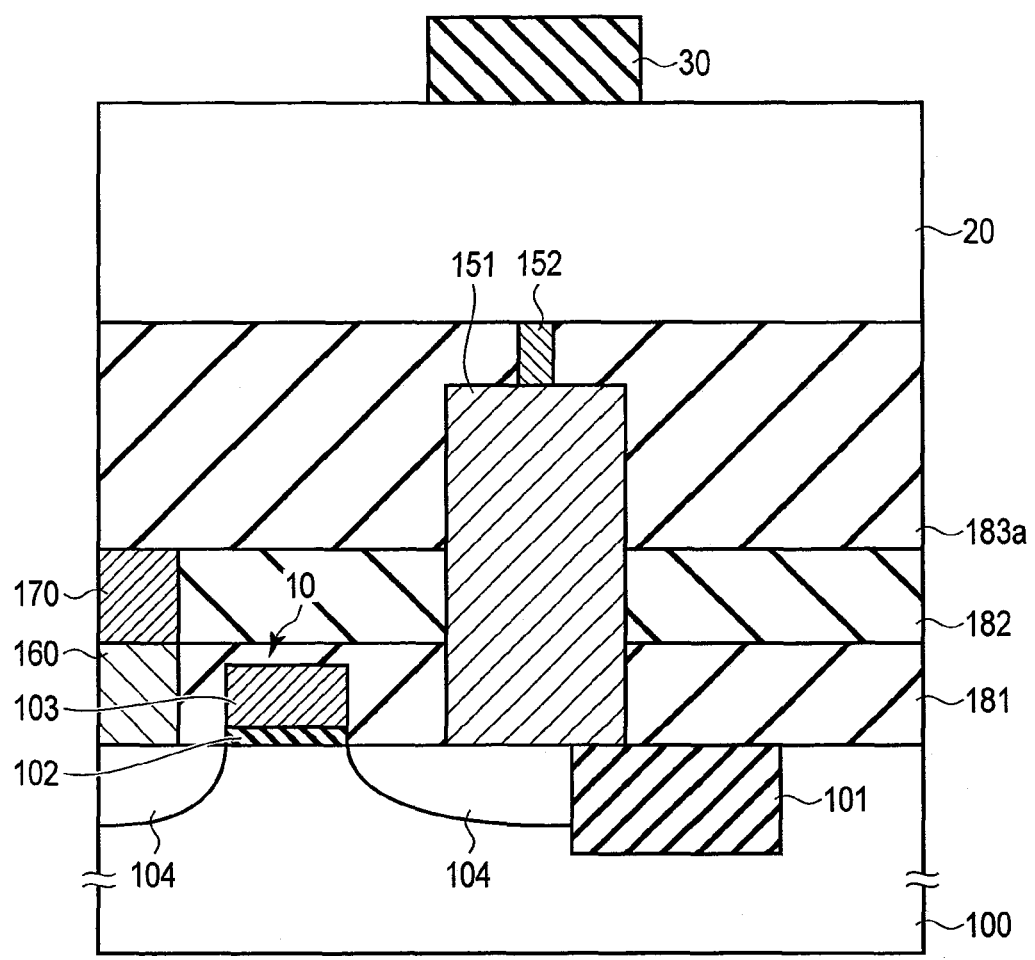
F I G. 6

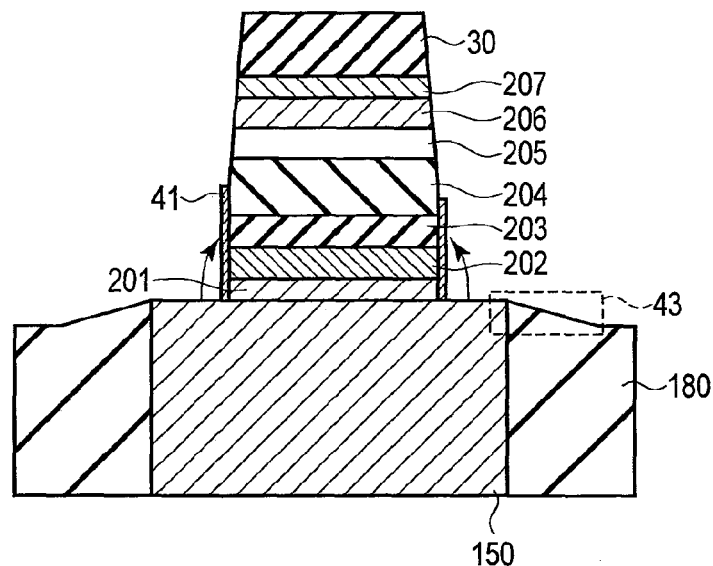
F I G. 7
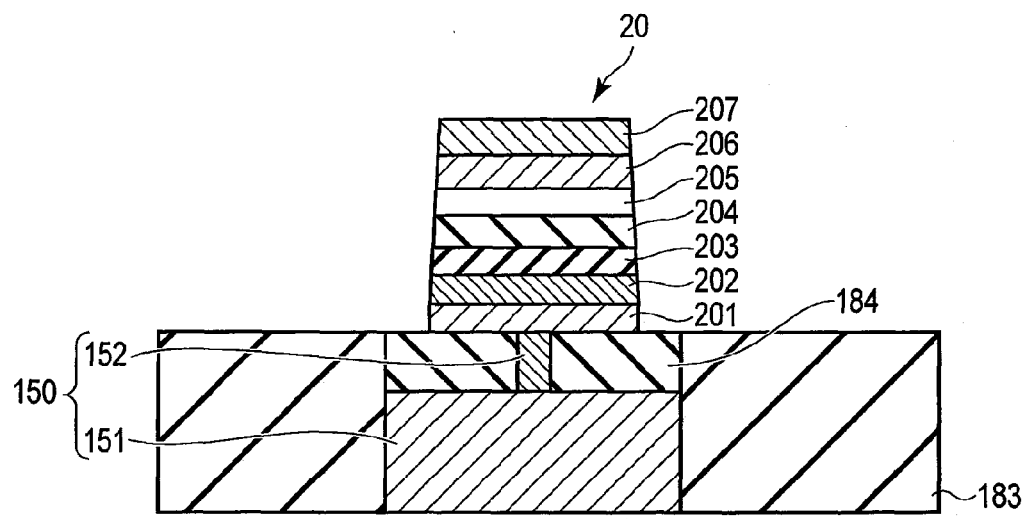
F I G. 8

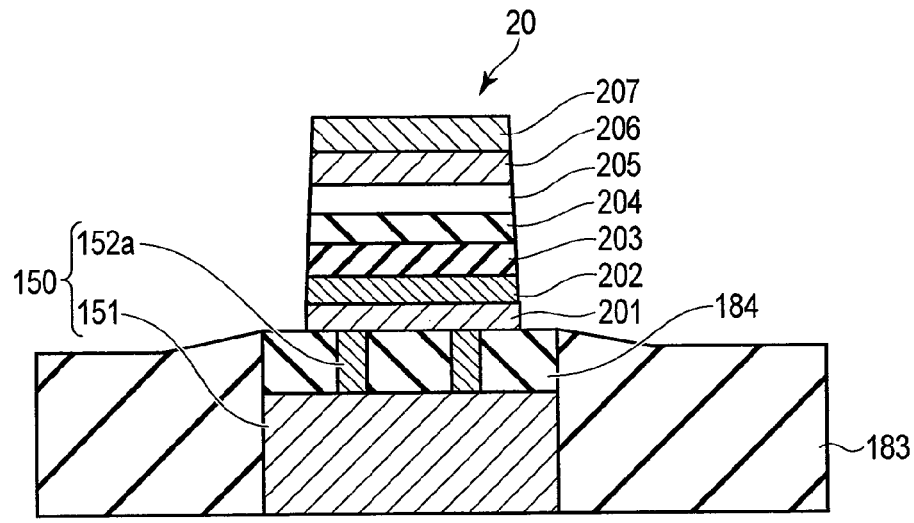
F I G. 15
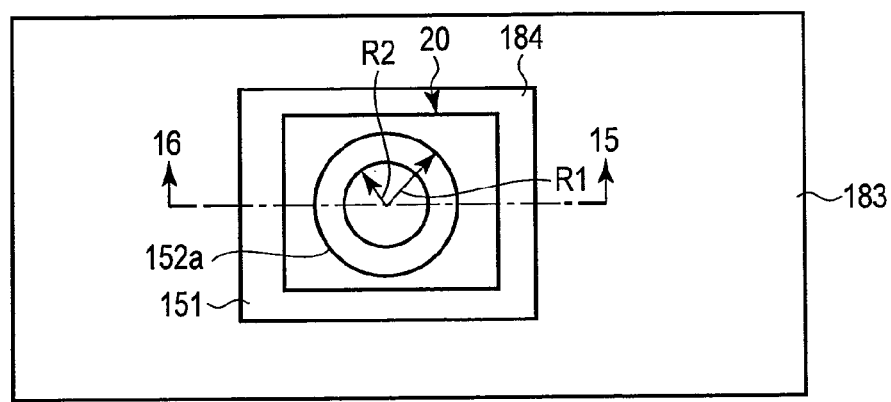
F I G. 16

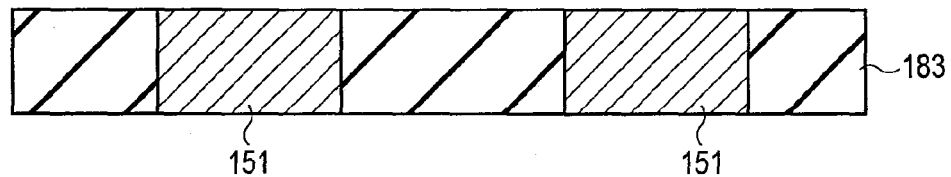
F I G. 2 4
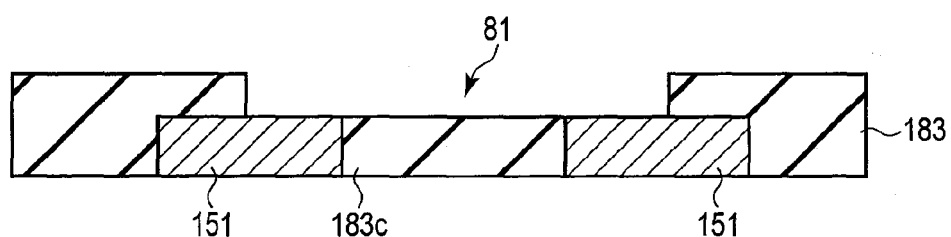
F I G. 2 5
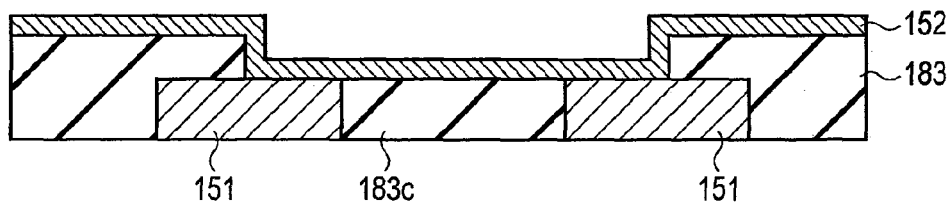
F I G. 2 6

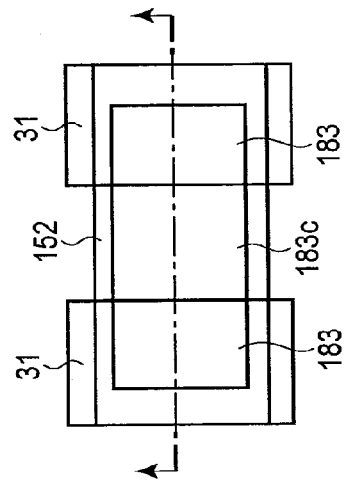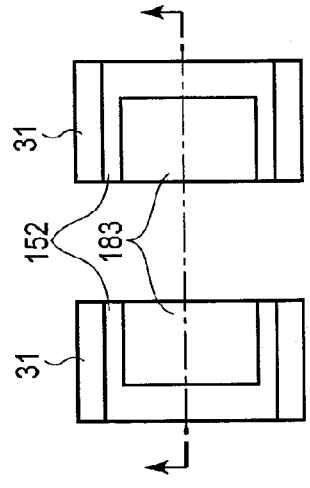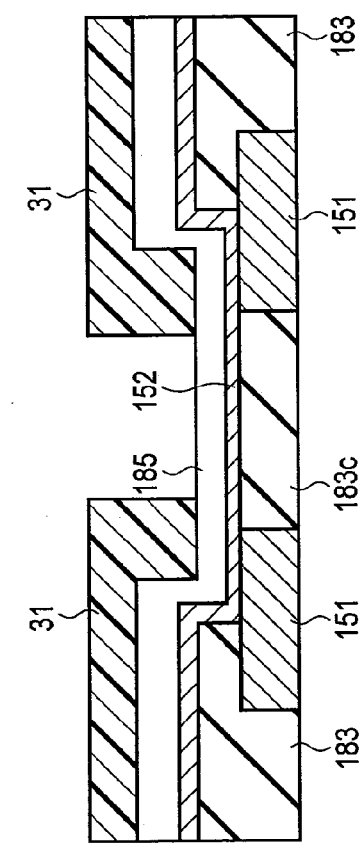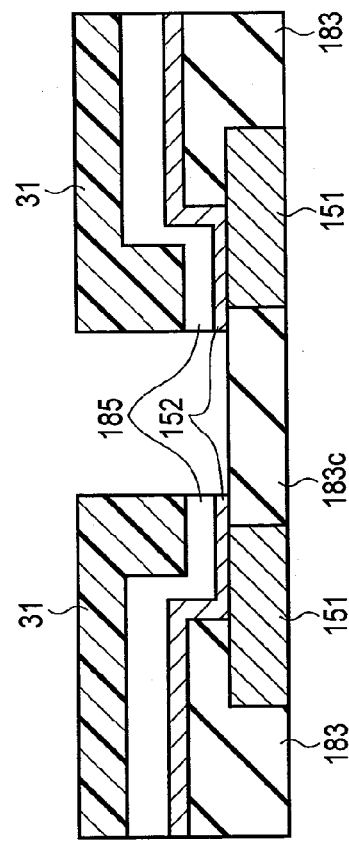

MAGNETIC MEMORY

CROSS-REFERENCE TO RELATED APPLICATIONS

This is a Continuation of U.S. Ser. No. 14/018,215, filed Sep. 4, 2013, which claims the benefit of U.S. Provisional Application No. 61/804,517, filed Mar. 22, 2013, the entire contents of which are incorporated herein by reference.

FIELD

Embodiments described herein relate generally to a magnetic memory having a magnetoresistive element and a manufacturing method thereof.

BACKGROUND

In recent years, a semiconductor memory with a resistance change element such as a PRAM (phase-change random access memory) or an MRAM (magnetic random access memory), has been attracting attention and being developed, in which the resistance change element is utilized as a memory element. The MRAM is a device which performs a memory operation by storing "1" or "0" information in a memory cell by using a magnetoresistive effect, and has such features as nonvolatility, high-speed operation, high integration and high reliability.

A large number of MRAMs, which use elements exhibiting a tunneling magnetoresistive (TMR) effect, among other magnetoresistive effects, have been reported. One of magnetoresistive effect elements is a magnetic tunnel junction (MTJ) element including a three-layer multilayer structure of a recording layer having a variable magnetization direction, an insulation film as a tunnel barrier, and a reference layer which maintains a predetermined magnetization direction.

The resistance of the MTJ element varies depending on the magnetization directions of the recording layer and reference layer. When these magnetization directions are parallel, the resistance takes a minimum value, and when the magnetization directions are antiparallel, the resistance takes a maximum value, and information is stored by associating the parallel state and antiparallel state with binary information "0" and binary information "1", respectively.

Write of information to the MTJ element involves a magnetic-field write scheme in which only the magnetization direction in the recording layer is inverted by a current magnetic field resulting from a current flowing through a write wire and a write (spin injection write) scheme using spin angular momentum movement in which the magnetization direction in the recording layer is inverted by passing a spin polarization current through the MTJ element itself.

In the former scheme, when the element size is reduced, the coercivity of a magnetic body constituting the recording layer increases and the write current tends to increase, and thus it is difficult to achieve both the miniaturization and reduction in electric current.

On the other hand, in the latter scheme (spin injection write scheme), as the volume of the magnetic layer constituting the recording layer becomes smaller, the number of spin-polarized electrons to be injected, may be smaller, and thus it is expected that both the miniaturization and reduction in electric current can be easily achieved.

BRIEF DESCRIPTION OF THE DRAWINGS

FIG. 2 is a cross-sectional view for explaining a manufacturing method of the magnetic memory according to the first embodiment;

FIG. 3 is a cross-sectional view for explaining the manufacturing method of the magnetic memory according to the first embodiment following FIG. 2;

FIG. 4 is a cross-sectional view for explaining the manufacturing method of the magnetic memory according to the first embodiment following FIG. 3;

FIG. 5 is a cross-sectional view for explaining the manufacturing method of the magnetic memory according to the first embodiment following FIG. 4;

FIG. 6 is a cross-sectional view for explaining the manufacturing method of the magnetic memory according to the first embodiment following FIG. 5;

FIG. 7 is a cross-sectional view for explaining a problem of a manufacturing method of a magnetic memory of a comparative example;

FIG. 8 is a cross-sectional view schematically illustrating a magnetic memory according to a second embodiment;

FIG. 15 is a cross-sectional view schematically illustrating a magnetic memory according to a third embodiment;

FIG. 16 is a plan view schematically illustrating a magnetic memory according to the third embodiment;

FIG. 24 is a cross-sectional view for explaining a manufacturing method of the magnetic memory according to the fourth embodiment;

FIG. 25 is a cross-sectional view for explaining the manufacturing method of the magnetic memory according to the fourth embodiment following FIG. 24;

FIG. 26 is a cross-sectional view for explaining the manufacturing method of the magnetic memory according to the fourth embodiment following FIG. 25;

FIG. 27A is a cross-sectional view for explaining the manufacturing method of the magnetic memory according to the fourth embodiment following FIG. 26;

FIG. 27B is a plan view for explaining the manufacturing method of the magnetic memory according to the fourth embodiment following FIG. 26;

FIG. 28A is a cross-sectional view for explaining the manufacturing method of the magnetic memory according to the fourth embodiment following FIG. 27A;

FIG. 28B is a plan view for explaining the manufacturing method of the magnetic memory according to the fourth embodiment following FIG. 27B;

DETAILED DESCRIPTION

Figure 1:
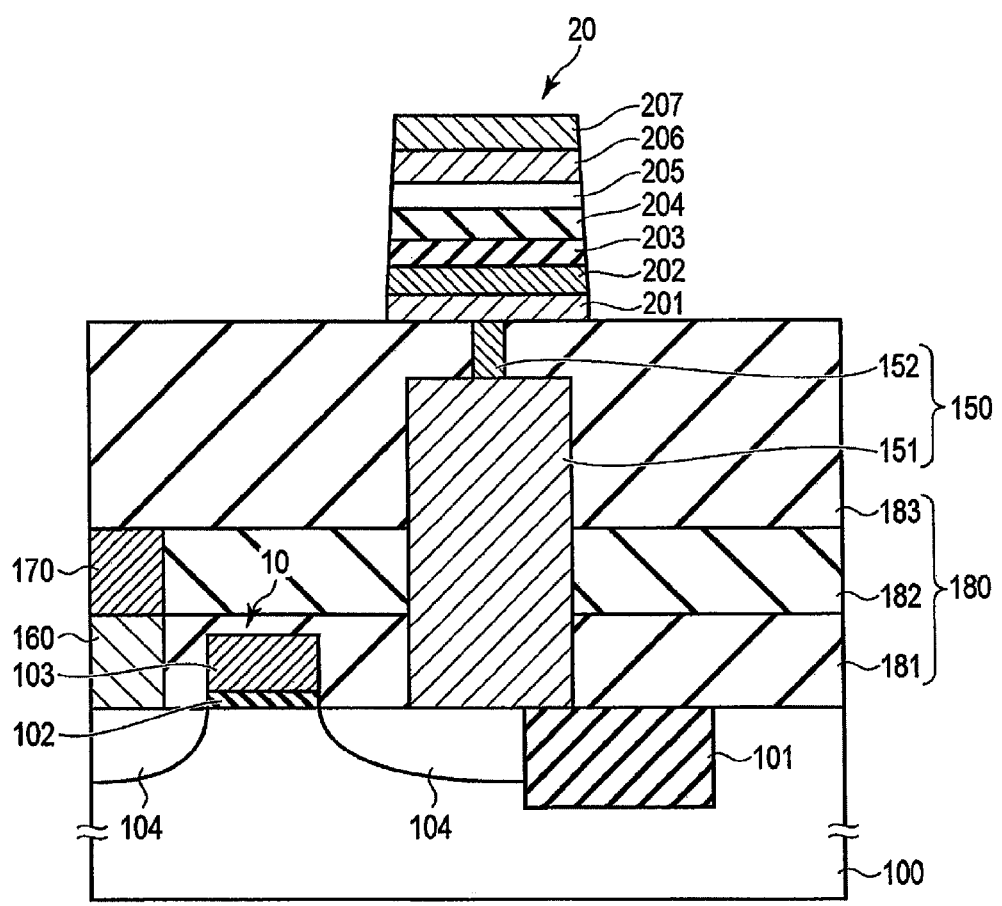
FIG. 1 is a cross-sectional view schematically illustrating a magnetic memory according to a first embodiment.

Embodiments will now be described with reference to the drawings. In the description recited below, members corresponding to the members already described are marked with like reference numerals and a detail description is omitted as appropriate.

In general, according to one embodiment, a magnetic memory is disclosed. The magnetic memory includes a substrate and a contact plug provided on the substrate. The contact plug includes a first contact plug and a second contact plug provided on the first contact plug and having a smaller diameter than that of the first contact plug. The magnetic memory further includes a magnetoresistive element provided on the second contact plug. The diameter of the second contact plug is smaller than that of the magnetoresistive element.

According to another embodiment, a method for manufacturing a magnetic memory is disclosed. The method includes forming a first insulating film on a substrate, forming a first contact plug in the first insulating film, and forming a second insulating film on the first insulating film. The method further includes forming a second contact plug connecting to the first contact plug in the second insulating film. The second contact has a smaller diameter than the of the first contact plug. The method further includes forming stacked films, which are to be processed into a magnetoresistive element on the second contact plug and the second insulating film, and forming the magnetoresistive element by processing the stacked film.

First Embodiment

FIG. 1 is a cross-sectional view schematically illustrating a magnetic memory according to a first embodiment.

In FIG. 1, 100 denotes a silicon substrate (a semiconductor substrate), and an isolation region 101 is formed on a surface of the silicon substrate 100. A selection transistor 10 is formed on a region (active area) separated by the isolation region 101. As the selection transistor 10, a planar MOS transistor is shown in FIG. 1, but an SGT (Surrounding Gate Transistor) may be used.

The selection transistor 10 includes a gate insulating film 102 formed on the surface of the silicon substrate 100, a gate electrode 103 formed on the gate insulating film 102, and a pair of source and drain regions 104 formed so as to sandwich the gate electrode 103.

The selection transistor 10 is an element for selecting an MTJ element 20. One of the source and drain regions 104 of the selection transistor 10 is connected to an MTJ element 20 via a contact plug 150 (151, 152). The planar shape of the contact plug 150 (151, 152) and the MTJ element 20 are, for example, a circular shape.

The contact plug 150 includes a lower contact plug (a first contact plug) 151 and an upper contact plug (a second contact plug) 152 that is provided on a central area of the upper surface of the lower contact plug 151 and has a diameter smaller than that of the lower contact plug 151. The contact plug 150 is provided in an interlayer insulating film 180 (interlayer insulating films 181, 182, and 183). The upper surface of the interlayer insulating film 180 is planar.

The other of the source and drain regions 104 of the selection transistor 10 is connected to a wiring 170 via a contact plug 160. The contact plug 160 is provided in the interlayer insulating film 181 and the wiring 170 is provided in the interlayer insulating film 182.

The MTJ element 20 includes a lower electrode 201, a storage layer 202, a tunnel barrier layer 203, a reference layer 204, a shift adjustment layer 205, a capping layer 206, and an upper electrode 207. The thickness of the storage layer 202 is, for example, 1 nm. The thickness of the tunnel barrier layer 203 is, for example, 1 nm. The diameter of the MTJ element is, for example, 34 nm. The shift adjustment layer 205 has a function to lessen and adjust a shift of switching current in the storage layer 202 caused by a leakage magnetic field from the reference layer 204.

The MTJ element 20 having the top pin structure is shown in FIG. 1 shows, but the present embodiment is effective in a case of an MTJ element having a bottom pin structure. That is, the present embodiment is effective regardless of the structure of the MTJ element.

The lower electrode 201 of the MTJ element 20 is connected to an upper surface of the upper contact plug 152. The upper surface of the upper contact plug 152 is covered by the lower electrode 201. The diameter of the upper contact plug 152 is smaller than the diameters of the lower contact plug 151 and the MTJ element 20. In the case of a 1 Gb MRAM cell, for example, the diameter of the upper contact plug 152 is 5 nm, the diameter of the lower contact plug 151 is 50 nm, and the diameter of the MTJ element 20 is 35 nm.

Since the diameter of the upper contact plug 152 is relatively small as just described, the planarity of the upper surface of the upper contact plug 152 is secured. As a result, the upper surface of the upper contact plug 152 and the upper surface of the interlayer insulating film 180 exist in the substantially same plane. That is, an underlying layer of the lower electrode 201 (the upper surfaces of the upper contact plug 152 and the interlayer insulating film) is flat.

In general, a characteristic of the MTJ element is sensitive to the flatness of the underlying layer. In the present embodiment, since the underlying layer of the lower electrode 201 has a flat surface as described above, the degradation of the characteristic of the MTJ element 20 is suppressed.

Moreover, the diameter of the lower contact plug 151 also need not be larger than the diameter of the MTJ element 20, the lower contact plug 151 does not prevent the magnetic memory from being downscaled.

The magnetic memory of the present embodiment will be further described below by following a manufacturing process of the magnetic memory of the present embodiment.

First, as shown in FIG. 2, the isolation region 101, the selection transistor 10, the interlayer insulating film 181, the contact plug 160, the interlayer insulating film 182, and the wiring 170 are formed on the silicon substrate 100 using well-known methods.

Next, as shown in FIG. 3, an interlayer insulating film 183a is formed over the entire surface, a contact hole is formed in the interlayer insulating films (the first insulating film) 183a, 182, and 181, hereafter a conductive film 151 to be processed into the lower contact plug is formed over the entire surface. The conductive film 151 is formed so as to fill the contact hole.

A material (a first material) of the conductive film 151 (the lower contact plug) includes, for example, tungsten (W), copper (Cu), and titanium nitride (TiN). In the case of using W or Cu, the contact hole is filled with the conductive film 151 after a barrier metal film is formed on inner surfaces (bottom surface and side surface) of the contact hole. This barrier metal film may be, for example, a single layer film of a titanium (Ti) film or a titanium nitride (TiN) film, or a stacked film of a Ti film and a TiN film.

Next, as shown in FIG. 4, by using CMP (Chemical Mechanical Polishing) process, the lower contact plug 151 outside the contact hole is removed to form the lower contact plug 151, and the surfaces of the interlayer insulating film 183a and the lower contact plug 151 are planarized.

Next, as shown in FIG. 5, an interlayer insulating film 183b (a second insulating film) is formed on the entire surface (the region including the lower contact plug 151 and the interlayer insulating film 183a), a contact hole is formed in the interlayer insulating film 183b, and a conductive film 152 to be processed into the upper contact plug is formed on the entire surface so as to fill the contact hole. Thereafter, as in the case of the lower contact plug 151, an upper contact plug 152 is formed and the surfaces of the interlayer insulating film 183b and the upper contact plug 152 are planarized by using CMP process.

A material (a second material) of the conductive film (the upper contact plug) 152 includes, for example, at least one of tantalum (Ta), silicon (Si), Ti, Cu, W, Al, hafnium (Hf), boron (B), cobalt (Co), and carbon nanotube. Si is, for example, polycrystalline silicon (poly-Si).

In the case of using W or Cu as the material of the conductive film 152, the contact hole is filled with the conductive film 152 after a barrier metal film is formed first on the inner surfaces (the bottom surface and side surface) of the contact hole. This barrier metal film may be, for example, a single layer film of a Ti film or a TiN film, or a stacked film of a Ti film and a TiN film.

An increasing of contact resistance between the MTJ element 20 (the lower electrode 201) and the upper contact plug 152 is suppressed by selecting a material having a resistance lower than that of lower contact plug 151 as a material of the upper contact plug 152. The material of the lower contact plug 151 and the material of the upper contact plug 152 may be the same if a sufficient contact resistance is secured.

In the manufacturing method of the present embodiment, the stacked film of the interlayer insulating film 183a and the interlayer insulating film 183b corresponds to the interlayer insulating film 183 in FIG. 1.

Next, as shown in FIG. 6, the magnetic memory structure shown in FIG. 1 is obtained by using well-known processes, which includes forming stacked films 20 (indicated as a single layer film in FIG. 6) to be processed into the MTJ element on the interlayer insulating film 183 and the upper contact plug 152, forming an etching mask 30 on the stacked film 20, and processing the stacked film 20 by IBE (Ion Beam Etching) using the etching mask 30 as a mask to form the MTJ element 20. A dry etching method other than IBE, for example, RIE (Reactive Ion Etching) may be used.

The etching mask 30 is, for example, a hard mask. Processes for forming the hard mask include, for example, a process for forming an insulating film to be processed into the hard mask, a process for forming a resist pattern on the insulating film, and a process for transferring the pattern of the resist pattern to the insulating film by etching the insulating film using the resist pattern as a mask.

In the present embodiment, no contact plug exists on a underlying layer of the stacked film 20 except a part covered by the etching mask 30, then a conductive material which arises from the etching of the contact plug does not adhere on a sidewall of the MTJ element. Thereby, a problem of a short-circuit between the storage layer and the reference layer due to the adhesion of the conductive material onto the side surface of the storage layer, the side surface of the tunnel barrier layer and side surface of the reference layer of the MTJ element does not arise.

In contrast, in the case of a comparative example, as shown in FIG. 7, a diameter of the contact plug 150 is larger than the diameter of the MTJ element. Therefore, the material of the contact plug 150 adheres onto the side surface of the MTJ element during the processing of the stacked film which are be processed into the MTJ element, and a layer 41 which causes the short-circuit between the storage layer 202 and the reference layer 204 is formed on the side surface of the MTJ element.

The reason for the diameter of the contact plug 150 being larger than the diameter of the MTJ element in the comparative example is as follows.

As described above, the characteristic of the MTJ element is sensitive to the flatness of the underlying layer. The underlying layer formed of the upper surface of the contact plug 150 and the upper surface of the interlayer insulating film 180 have a level difference 43. The reason the level difference 43 arises that there exists difference between a CMP rate of the contact plug 150 (metal) and a CMP rate of the interlayer insulating film 180 (dielectric material). As shown in FIG. 7, the CMP for securing the flatness of the underlying of the MTJ element may cause the level difference 43 at the outside of the MTJ element. Therefore, the diameter of the contact plug 150 is set to be larger than the diameter of the MTJ element in the comparative example. In the comparative example, scaling down of the magnetic memory is prevented by the contact plug 150 since the diameter of the contact plug 150 is larger than the diameter of the MTJ element.

Second Embodiment

FIG. 8 is a cross-sectional view schematically illustrating a magnetic memory according to a second embodiment.

The present embodiment is different from the first embodiment in that the side surface of the upper contact plug 152 is covered with an insulating film 184 (a second insulating film). A material of the insulating film 184 is different from the material of the interlayer insulating film 183 (the first insulating film) covering the side surface of the lower contact plug 151.

For example, when the material of the interlayer insulating film 183 is silicon oxide, the material of the insulating film 184 is silicon nitride. In this case, the insulating film 184 functions as a CMP stopper in the CMP process of the conductive film to be processed into the upper contact plug 152, as described later.

Moreover, when the material of the interlayer insulating film 183 is silicon oxide and the material of the upper contact plug 152 is Al, the material of the insulating film 184 is $Al_2O_3$. In this case, the material of the insulating film 184 and the material of the upper contact plug 152 include the same element (Al). When the material of the interlayer insulating film 183 is silicon nitride, this silicon nitride and the material of the upper contact plug 152 have a common element. By using the common element, the CMP rate of the insulating film 184 can be approximated to the CMP rate of the upper contact plug 152. As a result, in the above CMP process, the flatness of the underlying layer of the MTJ element 20 is improved, in which the underlying layer is formed of the upper surface of the upper contact plug 152 and the upper surface of part of the insulating film 184 around the upper contact plug 152.

The material of the lower contact plug 151 and the material of the upper contact plug 152 may be the same, or different.

FIGS. 9 to 14 are cross-sectional views illustrating a manufacturing method of the magnetic memory according to the present embodiment. The manufacturing method of the present embodiment is same as the manufacturing methods of the first embodiment up to the process of forming the interlayer insulating film 183. Thus, in the present embodiment, manufacturing processes after the interlayer insulating film 183 is formed will be described. For the sake of simplicity, the parts lower than the upper part of interlayer insulating film 183 are omitted in FIGS. 9 to 14.

Figure 9:
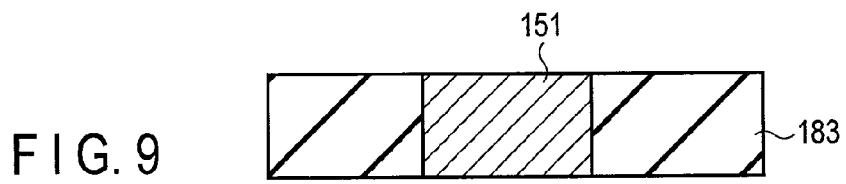
FIG. 9 is a cross-sectional view for explaining a manufacturing method of the magnetic memory according to the second embodiment.

As shown in FIG. 9, the first contact hole is formed in the interlayer insulating film 183, thereafter the lower contact plug 151 is buried in the first contact hole by a well-known method (deposition of a conductive film and CMP). The material of the lower contact plug 151 is, for example, titanium nitride (TiN).

Figure 10:
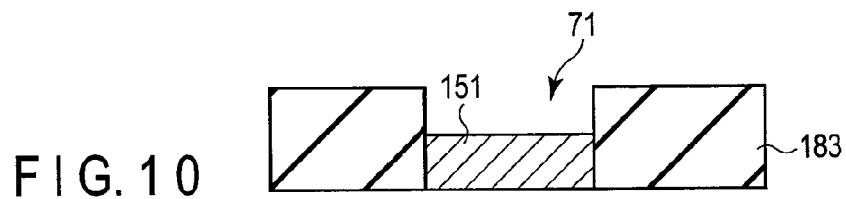
FIG. 10 is a cross-sectional view for explaining the manufacturing method of the magnetic memory according to the second embodiment following FIG. 9.

Next, as shown in FIG. 10, the upper part of the lower contact plug 151 is removed by etching back the lower contact plug 151. As a result, upper part of the first contact hole is changed into a trench 71 which is not filled with the first contact plug. The upper part of the lower contact plug 151 is removed by an amount corresponding to the height of the upper contact plug.

Figure 11:
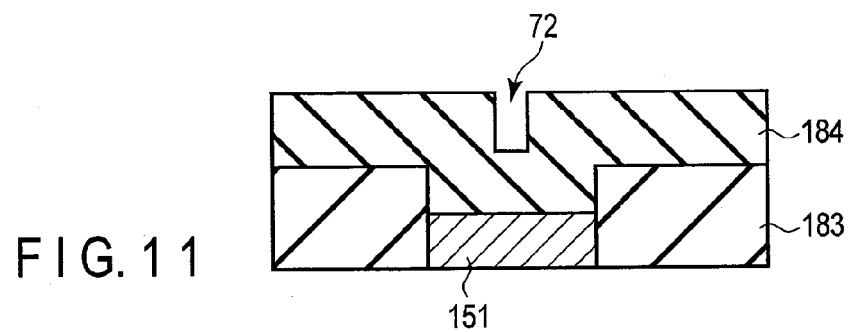
FIG. 11 is a cross-sectional view for explaining the manufacturing method of the magnetic memory according to the second embodiment following FIG. 10.

Next, as shown in FIG. 11, an insulating film 184 is formed on the surfaces of the lower contact plug 151 and the interlayer insulating film 183. The trench is filled with the insulating film 184.

A concave portion 72 is formed in the surface of the insulating film 184 due to the influence of the trench. The insulating film 184 is formed such that the diameter of the concave portion 72 is to be the same as the diameter of the upper contact plug (for example, 10 nm or less). The thickness of the insulating film 184 is, for example, 20 nm. The insulating film 184 can be formed, for example, by using ALD (Atomic Layer Deposition) process.

Figure 12:
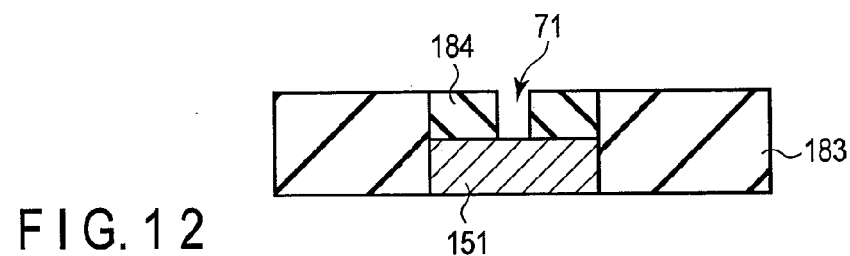
FIG. 12 is a cross-sectional view for explaining the manufacturing method of the magnetic memory according to the second embodiment following FIG. 11.

Next, as shown in FIG. 12, the insulating film 184 outside the trench 71 and the insulating film 184 under the concave portion are removed by etching back the insulating film 184. As a result, a second contact hole that reaches the lower contact plug 151 is formed in the insulating film 184 in a self-alignment manner.

Figure 13:
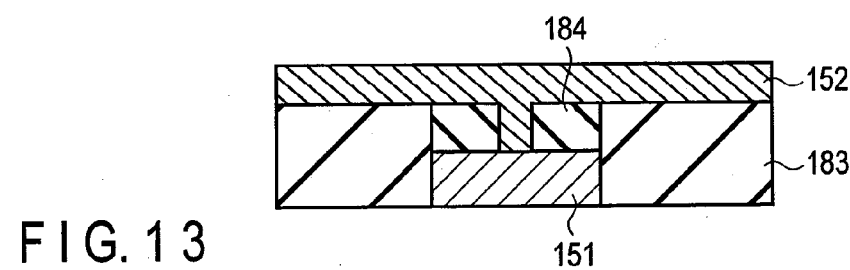
FIG. 13 is a cross-sectional view for explaining the manufacturing method of the magnetic memory according to the second embodiment following FIG. 12.

Next, as shown in FIG. 13, a conductive film 152 to be processed into an upper contact plug is formed over the entire surface, so that the second contact hole is filled with the conductive film 152.

Figure 14:
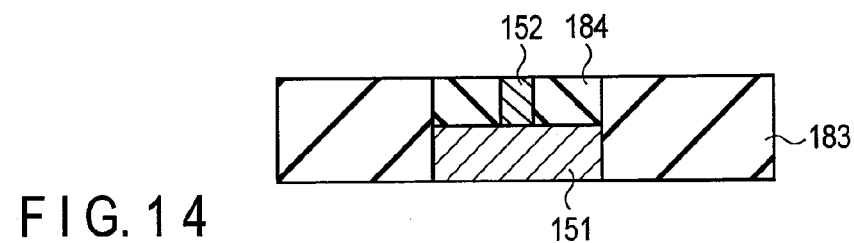
FIG. 14 is a cross-sectional view for explaining the manufacturing method of the magnetic memory according to the second embodiment following FIG. 13.

Next, as shown in FIG. 14, the conductive film 152 outside the second contact hole is removed by CMP process. During this CMP process, the insulating film 184 is used as a CMP stopper. Consequently, the upper contact plug 152 and the insulating film 184 having flat surfaces are formed. Thereafter, the well-known MTJ process (such as forming stacked films to be processed into the magnetoresistive element on the upper contact plug 152 and the insulating film 184, forming the magnetoresistive element by processing the stacked film by using dry etching).

Third Embodiment

FIG. 15 is a cross-sectional view schematically illustrating a magnetic memory according to a third embodiment. For the sake of simplicity, the parts lower than the upper part of the interlayer insulating film 183 are omitted in FIG. 15. FIG. 15 corresponds to the cross-sectional view along arrows 15-15 in FIG. 16.

The present embodiment is different from the second embodiment in that an upper contact plug 152a in the present embodiment has a hollow structure where a hollow space exists along the height direction. Here, the hollow structure is a hollow cylinder. The upper contact plug 152 in the first embodiment is a solid such as a cylinder or cuboid that has no hollow space.

The difference between the outer radius (R1) and the internal radius (R2) of the upper contact plug 152a of the present embodiment (R1–R2) corresponds to the diameter of the upper contact plug 152 of the first embodiment. In this case, the contact area between the upper contact plug 152a and the lower electrode 201 of the MTJ element 20 of the present embodiment is larger than the contact area between the upper contact plug 152 and the lower electrode 201 of the MTJ element 20 of the first embodiment. The upper contact plug 152a of the present embodiment has an advantage in reducing contact resistance.

In case of the present embodiment, as shown in FIG. 15, the upper contact plug 152a have two connection portions with the lower contact plug 151 in a cross section of the upper contact plug 152a and the lower contact plug 151 taken along the plane defined by a normal line perpendicular to a stacking direction of the upper contact plug 152a and the lower contact plug 151.

FIGS. 17 to 21 are cross-sectional views illustrating a manufacturing method of the magnetic memory according to the present embodiment.

First, as the second embodiment, processes of FIGS. 9 and 10 are performed.

Figure 17:
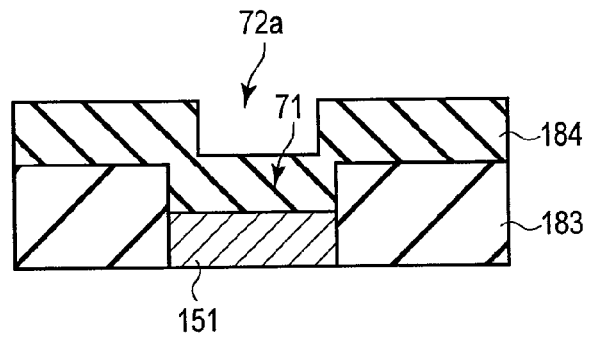
FIG. 17 is a cross-sectional view for explaining a manufacturing method of the magnetic memory according to the third embodiment.

Next, as shown in FIG. 17, an insulating film 184 (a second insulating film) is formed on surfaces of the lower contact plug 151 and the interlayer insulating film 183 (the first insulating film). The interlayer insulating film 183 and the material of the insulating film 184 are respectively formed of different materials. As an example of material of the insulating film 184, a material which functions as a CMP stopper for CMP process (FIG. 21) may be used.

The trench 71 is filled with the insulating film 184. A concave portion 72a is formed on the surface of the insulating film 184 due to the trench 71 (underlying layer). The insulating film 184 is formed so that the diameter of the concave portion 72a is twice as large as the outer radius R1. The insulating film 184 can be formed by using, for example, ALD process.

Figure 18:
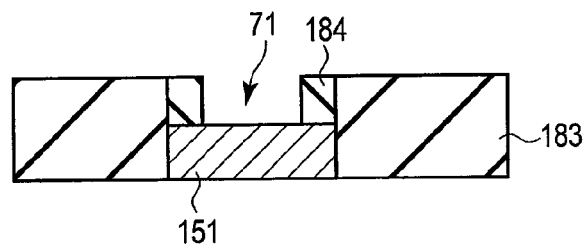
FIG. 18 is a cross-sectional view for explaining the manufacturing method of the magnetic memory according to the third embodiment following FIG. 17.

Next, as shown in FIG. 18, the insulating film 184 outside the trench 71 and the insulating film 184 under the concave portion are removed by etching back the insulating film 184.

As a result, an opening portion that reaches the first contact plug 171 and has a diameter twice as large as the outer radius of the upper contact plug is formed in the insulating film 184 in a self-alignment manner.

Figure 19:
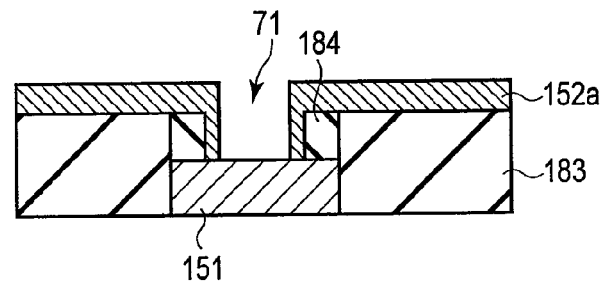
FIG. 19 is a cross-sectional view for explaining the manufacturing method of the magnetic memory according to the third embodiment following FIG. 18.

Next, as shown in FIG. 19, a conductive film 152a to be processed into an upper contact plug is formed over the entire surface without fill the concave portion, thereafter the conductive film 152a is etched back. This etch-back process removes the conductive film 152a in a central portion of trench 71. The diameter of the central portion of trench 71 corresponds to a diameter twice as large as the internal radius R1.

Figure 20:
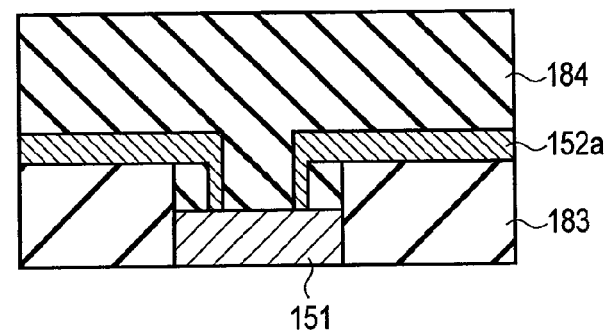
FIG. 20 is a cross-sectional view for explaining the manufacturing method of the magnetic memory according to the third embodiment following FIG. 19.

Next, as shown in FIG. 20, an insulating film 184 (a third insulating film) is formed over the entire surface again. The central portion of trench is filled with the insulating film 184. In the process, the thickness of the insulating film 184 is chosen so that the upper surface of the insulating film 184 is to be substantially planar.

Figure 21:
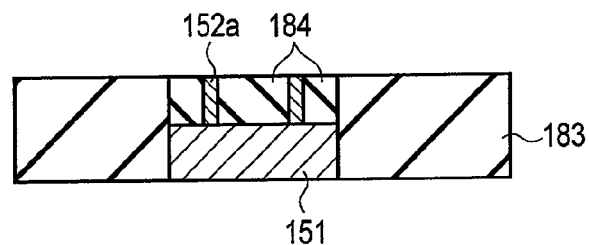
FIG. 21 is a cross-sectional view for explaining the manufacturing method of the magnetic memory according to the third embodiment following FIG. 20.

Next, as shown in FIG. 21, an upper contact plug 152a having a hollow cylinder structure is formed by polishing the insulating film 184 and the conductive film 152a by using CMP process. Thereafter, well-known MTJ process (such as forming a stacked films to be a magnetoresistive element on the upper contact plug 152a and the insulating film 184, forming the magnetoresistive element by processing the stacked films by using dry etching) follows.

The insulating film 184 around the upper contact plug 152a may be the interlayer insulating film 183 as the first embodiment.

Fourth Embodiment

Figure 22:
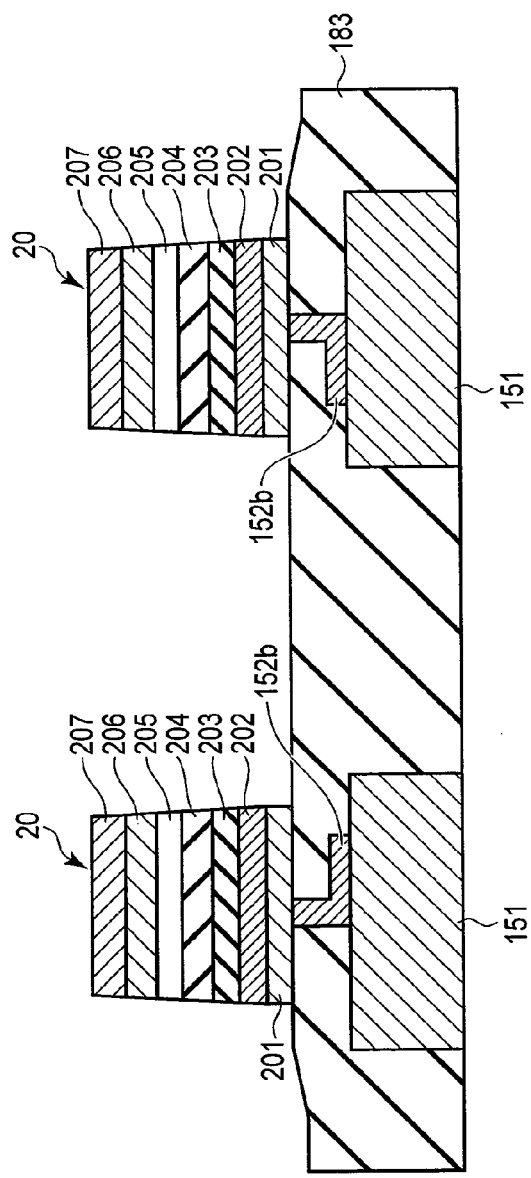
FIG. 22 is a cross-sectional view schematically illustrating a magnetic memory according to a fourth embodiment.
Figure 23:
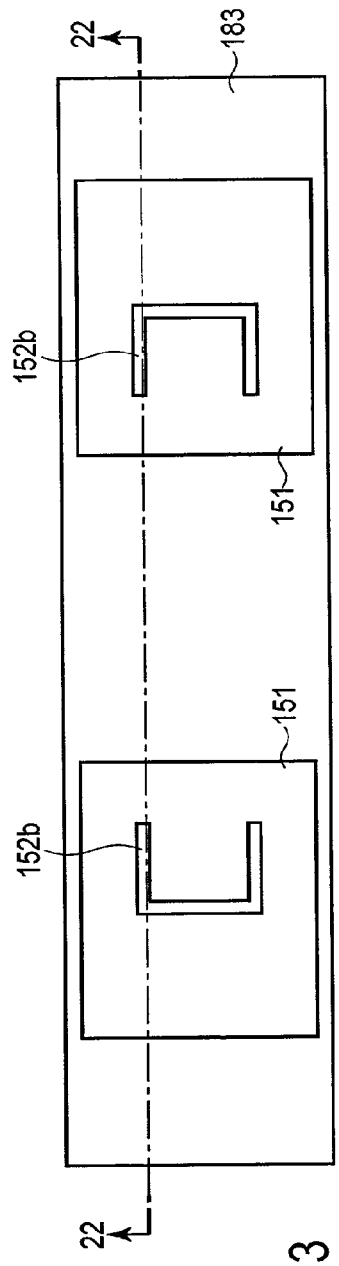
FIG. 23 is a plan view schematically illustrating a magnetic memory according to the fourth embodiment.

FIG. 22 is a cross-sectional view schematically illustrating a magnetic memory according to a fourth embodiment. FIG. 22 corresponds to the cross-sectional view along arrows 23-23 in FIG. 23.

The present embodiment is different from the first embodiment in that an upper contact plug 152b of the present embodiment includes a three-dimensional structure in a form of the letter L (an L-shaped structure). This L-shaped structure exists under the MTJ element 20. Each of two adjacent MTJ elements is provided with the upper contact plug 152b. In the following description, the MTJ element 20 shown on the left side in FIG. 22 is referred to as a first MTJ element, and the MTJ element on the right side is referred to as a second MTJ element.

Since there are an infinite number of planes defined by normal lines perpendicular to the height direction of upper contact plug 152a, there also exist an infinite number of cross sections of the upper contact plug 152a defined by normal lines perpendicular to the height direction of upper contact plug 152a. However, as shown in FIG. 22, there exists a cross section in which the shape of the upper contact plug 152a is the letter L-shaped. For example, as shown in FIG. 22, the shape of the letter L exists in the cross section taken along a line connecting two adjacent MTJ elements.

FIGS. 24 to 31 are cross-sectional views illustrating a manufacturing method of the magnetic memory according to the present embodiment. The manufacturing method of the present embodiment is same as the manufacturing methods of the first embodiment up to the process of forming the interlayer insulating film 183. Thus, in the present embodiment, manufacturing processes after the interlayer insulating film 183 is formed will be described. For the sake of simplicity, the parts lower than the upper part of interlayer insulating film 183 are omitted in FIGS. 24 to 31.

As shown in FIG. 24, a lower contact plug 151 for the first MTJ element (hereinafter, referred to as lower contact plug for 1MTJ) and a contact plug 151 for the second MTJ element (hereinafter, referred to as lower contact plug for 2MTJ) are formed in the interlayer insulating film 183 by well-known methods (opening a contact hole, forming a conductive film, CMP for the conductive film).

Next, as shown in FIG. 25, the upper part of the interlayer insulating film 183c between the lower contact plug for 1MTJ 151 and the lower contact plug for 2MTJ 151, an upper portion of the lower contact plug for 1MTJ 151 on the side of the interlayer insulating film 183c, and an upper portion of the lower contact plug for 2MTJ 151 are removed by an amount corresponding to the height of the upper contact plug.

As a result, a trench 81 is formed on the surfaces of the lower contact plug for 1MTJ 151, the lower contact plug for 2MTJ 151, and the interlayer insulating film 183. An area of trench 81 is large since the trench 81 is provided on areas corresponding to two MTJ elements and the interlayer insulating film 183c therebetween.

Next, as shown in FIG. 26, a conductive film 152 to be processed into upper contact plugs is formed over the entire surface. Though the bottom surface and side surface of the trench 81 are covered with the conductive film 152, the trench 81 is not filled with the conductive film 152. The conductive film 152 can be formed on the side surface of the trench 81 with precision since the trench 81 is large as described above. That is, it is possible to form a uniformly thin conductive film 152 on the side surface of the trench 81. This is advantage for miniaturizing the magnetic memory.

Next, as shown in FIGS. 27A and 27B, an insulating film 185 is formed on the conductive film 152, thereafter a resist pattern 31, which is used for processing a conductive film 152 to be an upper contact plug, is formed on the insulating film 185.

Next, as shown in FIGS. 28A and 28B, the surface of the interlayer insulating film 183 is exposed by etching the insulating film 185 and the conductive film 152 using the resist pattern 31 as a mask. After the etching, the resist pattern 31 is removed.

Figure 29B:
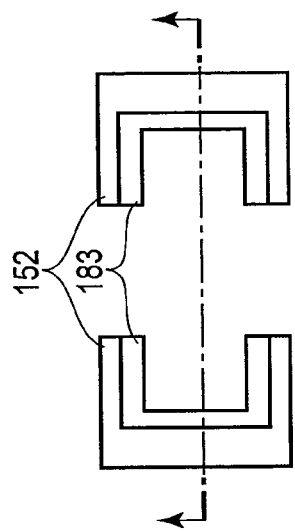
FIG. 29B is a plan view for explaining the manufacturing method of the magnetic memory according to the fourth embodiment following FIG. 28B.
Figure 29A:
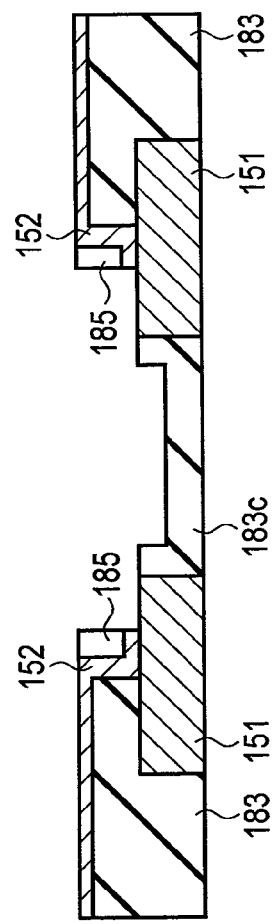
FIG. 29A is a cross-sectional view for explaining the manufacturing method of the magnetic memory according to the fourth embodiment following FIG. 28A.

Next, as shown in FIGS. 29A and 29B, the upper contact plug 152 for the first MTJ element and the upper contact plug 152 for the second MTJ element are formed by etching back process the insulating film 185, the conductive film 152, and the interlayer insulating film 183.

Figure 30:
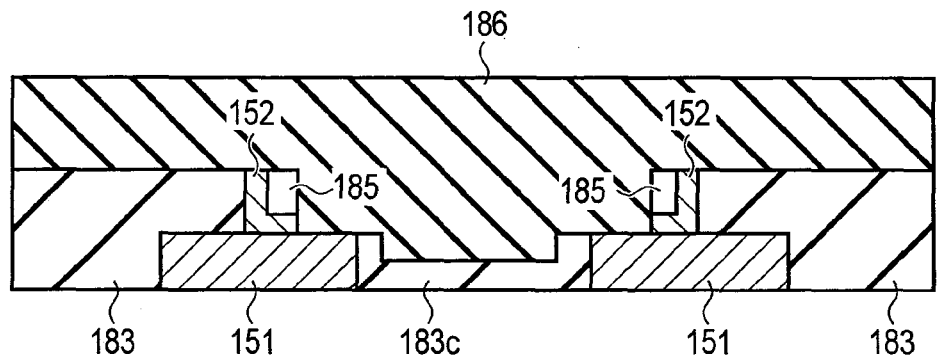
FIG. 30 is a cross-sectional view for explaining the manufacturing method of the magnetic memory according to the fourth embodiment following FIG. 29A.

Next, as shown in FIG. 30, an insulating film 186 is formed over the entire surface so as to fill the concave portion formed on the surface shown in FIG. 29A. Materials of the insulating films 186 and 185 may be same, or may be different. For example, a material easily polished by CMP process (silicon oxide) is used as the material of insulating film 186, and a material usable as a CMP stopper (silicon nitride) is used as the material of insulating film 185.

Figure 31:
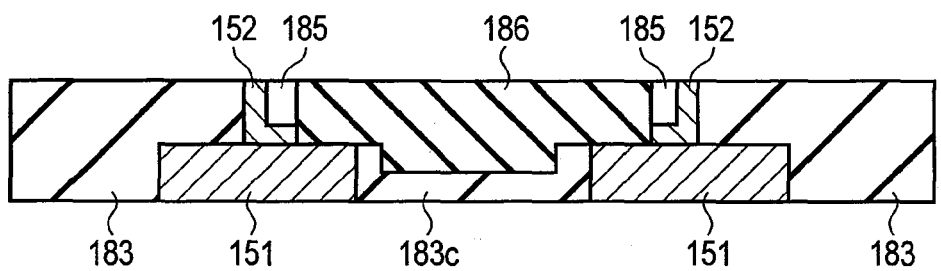
FIG. 31 is a cross-sectional view for explaining the manufacturing method of the magnetic memory according to the fourth embodiment following FIG. 30.

Next, as shown in FIG. 31, the insulating film 186 is polished by CMP process, and the upper surface of the upper contact plug 152 is exposed. Thereafter, the well-known MTJ process follows.

Figure 32:
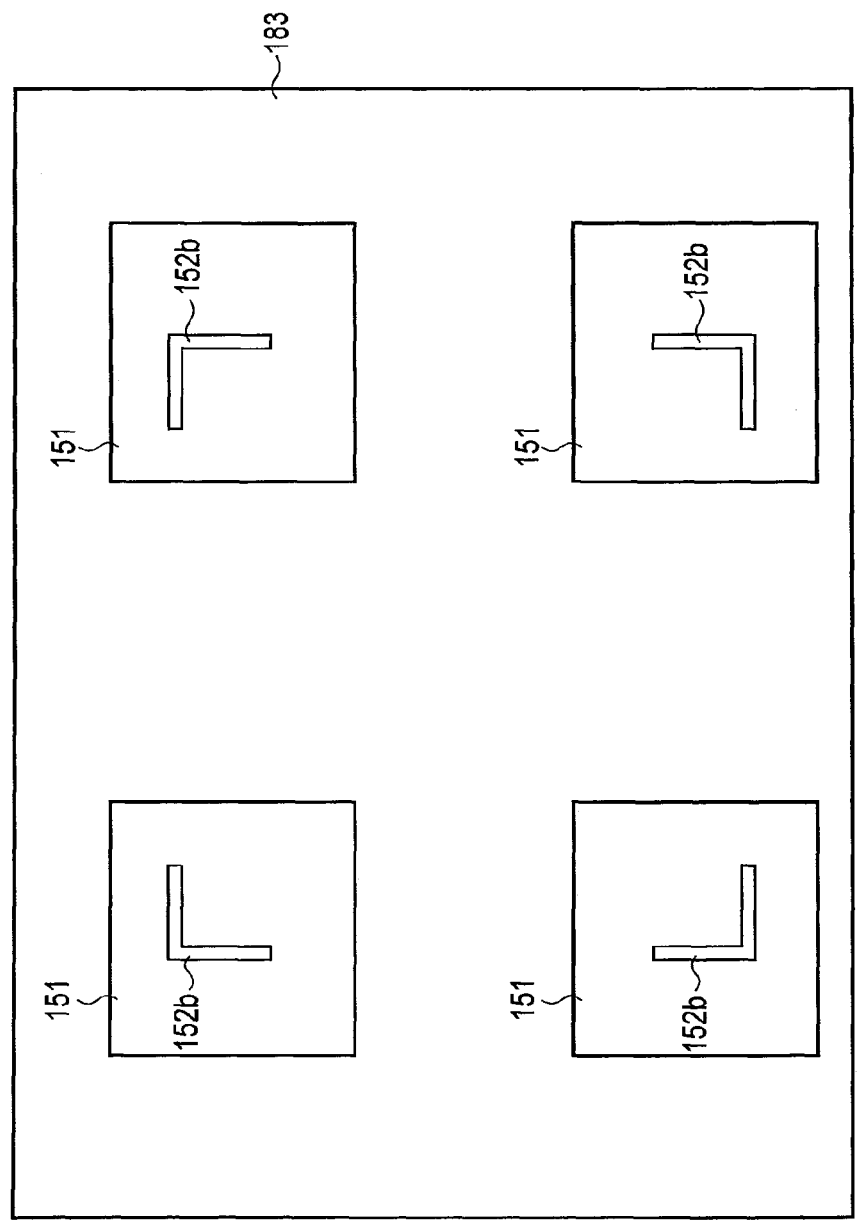
FIG. 32 is a cross-sectional view for explaining a variation of the magnetic memory according to the fourth embodiment.

The present embodiment (FIG. 23) explains a case where two contact plugs connecting to the lower electrodes adjacent MTJ elements are simultaneously formed, however as shown in FIG. 32, four contact plugs connecting to lower electrodes of four MTJ elements arranged at four positions corresponding to four apexes of a rectangle.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
   a substrate;
   a contact plug provided on the substrate, the contact plug including a first contact plug, and a second contact plug provided on the first contact plug, wherein the second contact plug comprises a material different from a material of the first contact plug;
   a magnetoresistive element provided on the contact plug,
   a first insulating film covering a side surface of the first contact plug;
   a second insulating film covering a side surface of the second contact plug and an entire upper surface of the first insulating film, wherein the second insulating film comprises a material different from a material of the first insulating film,
   wherein the first contact plug, the second contact plug, and the magnetoresistive element satisfy relationships L1>L2 and L2<L3,
   where L1, L2 and L3 are respectively lateral dimensions of the first contact plug, the second contact plug, and the magnetoresistive element, in a cross section parallel to a stacked direction of the first contact plug, the second contact plug, and the magnetoresistive element.

2. The magnetic memory according to claim 1, wherein the second insulating film includes an element constituting the second contact plug.

3. The magnetic memory according to claim 2 wherein the second insulating film includes a nitrided or oxidized material of at least one of tantalum, silicon, titanium, copper, tungsten, aluminum, hafnium, boron, cobalt, and carbon nanotube.

4. The magnetic memory according to claim 1, wherein the second contact plug contacts an upper surface of the first contact plug at two portions which are apart from each other.

5. The magnetic memory according to claim 1, wherein the upper surface of the first insulating film is flush with an upper surface of the first contact plug, and an upper surface of the second insulating film is flush with an upper surface of the second contact plug.

6. The magnetic memory according to claim 1, wherein a center of the magnetoresistive element coincides with a center of the contact plug.

7. The magnetic memory according to claim 1, wherein the magnetoresistive element is a spin injection writing type MTJ element.

* * * * *